(12) United States Patent
Dietz et al.

(10) Patent No.: US 8,344,523 B2
(45) Date of Patent: Jan. 1, 2013

(54) CONDUCTIVE COMPOSITION

(75) Inventors: Raymond L. Dietz, Amesbury, MA (US); Maciej Patelka, Salem, MA (US); Akito Yoshii, Niigata (JP); Pawel Czubarow, Wellesley, MA (US); Takashi Sakamoto, Shibata (JP); Yukinari Abe, Niigata (JP)

(73) Assignee: Diemat, Inc., Byfield, MA (US)

( * ) Notice: Subject to any disclaimer, the term of this patent is extended or adjusted under 35 U.S.C. 154(b) by 469 days.

(21) Appl. No.: 12/512,976

(22) Filed: Jul. 30, 2009

(65) Prior Publication Data

US 2010/0065790 A1 Mar. 18, 2010

Related U.S. Application Data

(63) Continuation-in-part of application No. 11/801,156, filed on May 8, 2007, now abandoned.

(60) Provisional application No. 60/799,068, filed on May 8, 2006.

(51) Int. Cl.
*H01B 1/22* (2006.01)

(52) U.S. Cl. .................... 257/783; 257/512; 257/514

(58) Field of Classification Search .............. 257/783
See application file for complete search history.

(56) References Cited

U.S. PATENT DOCUMENTS

| | | | |
|---|---|---|---|
| 5,488,082 A | 1/1996 | Dietz et al. | |
| 6,111,005 A | 8/2000 | Dietz et al. | |
| 6,140,402 A | 10/2000 | Dietz et al. | |
| 6,265,471 B1 | 7/2001 | Dietz | |
| 7,906,373 B1 | 3/2011 | Czubarow et al. | |
| 2001/0042854 A1 | 11/2001 | Matsumoto | |
| 2004/0000217 A1 | 1/2004 | Toshima et al. | |
| 2004/0004209 A1 | 1/2004 | Matsuba et al. | |
| 2004/0066633 A1* | 4/2004 | Yazaki et al. | 361/748 |
| 2005/0008832 A1 | 1/2005 | Santos et al. | |
| 2006/0040112 A1 | 2/2006 | Dean et al. | |
| 2006/0183625 A1* | 8/2006 | Miyahara | 501/98.4 |
| 2007/0187652 A1* | 8/2007 | Konno | 252/500 |
| 2007/0241303 A1 | 10/2007 | Zhong et al. | |
| 2008/0081243 A1* | 4/2008 | Wood et al. | 429/44 |
| 2008/0146016 A1* | 6/2008 | Schwirtlich et al. | 438/618 |

OTHER PUBLICATIONS

International Search Report dated May 30, 2011 for PCT/US2010/043186.

* cited by examiner

*Primary Examiner* — Telly Green
*Assistant Examiner* — Lawrence Tynes, Jr.
(74) *Attorney, Agent, or Firm* — Holtz Holtz Goodman & Chick, P.C.

(57) ABSTRACT

Conductive compositions which are useful as thermally conductive compositions and may also be useful as electrically conductive compositions are provided. The compositions include a conductive particle constituent in combination with a sintering aid which can, for example be a compound of the same metal in the nanometal, an organo-metallic, a metalorganic salt, mercaptan and/or resinate. In some embodiments the conductive particles include a small amount of nanoscale (<200 nm) particles. The compositions exhibit increased thermal conductivity.

45 Claims, 5 Drawing Sheets

CONDUCTIVE COMPOSITION

CROSS REFERENCE TO RELATED APPLICATION

This application is a Continuation-in-Part application of application Ser. No. 11/801,156 filed on May 8, 2007 (abandoned), which is based on Provisional application Ser. No. 60/799,068 filed on May 8, 2006.

FIELD OF THE INVENTION

The present invention relates generally to thermally conductive compositions.

BACKGROUND

The present invention relates to thermally enhanced adhesive pastes particularly well suited for bonding high density, microcircuit electronic components to substrates.

The attachment of high density, microcircuit components onto substrates, such as silicon dies onto ceramic sheet, has been an important aspect of the electronics industry for many years. Generally, it is known to use a die attach paste which is deposited between the die and substrate. Typically, the die attach paste includes a filler, an adhesive and a carrier. The filler is selected to impart to the finished bonding layer desired conductive, resistive or dielectric properties. The adhesive is chosen to create a strong bond between the die and substrate. The carrier maintains all the components in a fluid, uniform mixture, which allows the paste to be applied easily to the die-substrate interface. It also has suitable volatility to migrate from between the die and substrate following heat treatment of the assembly. After the paste is deposited and the die and substrate are assembled, the assembly is typically heated to fuse the adhesive and drive off the carrier. Upon cooling, the die is firmly attached to the substrate.

The power density of active components continues to rise, creating an increasing demand of higher thermally conductive adhesives to attach these components. These demands have previously been met by technologies described in the prior art, including U.S. Pat. Nos. 6,111,005 and 6,140,402. These patents describe a technology involving the use of powdered organic polymer resins, suspended in a non-solvent along with highly thermally conductive filler. The type of powered resin was varied depending on the application. For large area component attachments where the Coefficient of Thermal Expansion (CTE) mismatch to the substrate was also large, low modulus thermoplastic polymers were incorporated to handle the shear stress generated at the bondline of the adhesive. For smaller area components where the expansion mismatch to the substrate was lower, thermoset or combinations of thermoplastic and thermoset polymer powders were employed in the adhesive composition with the filler. The use of the higher modulus polymers also increased the thermal conductivity.

U.S. Pat. No. 6,265,471 describes an even higher thermal conductivity technology where the highly conductive filler is suspended in a liquid epoxy resin which is dissolved in a fugitive solvent. This technology increased the thermal conductivity over the prior technology described in U.S. Pat. Nos. 6,111,005 and 6,140,402. Unfortunately, the elastic modulus of the thermosetting liquid resin system was relatively high when cured or cross-linked. Consequently, the application of this technology was limited to small area component attach and or substrates that were closely matched in CTE to the component, usually a semiconductor die. The prior art described in the technologies described above clearly shows a linear relationship between the modulus and the thermal conductivity of the adhesive. Low modulus adhesives, described in U.S. Pat. Nos. 6,111,005 and 6,140,402, were lower in thermal conductivity, whereas the higher modulus adhesives described in U.S. Pat. No. 6,265,471 were higher in thermal conductivity. As higher function semiconductor devices grew in size and power, the need also grew for an adhesive with both high thermal conductivity and low modulus, such adhesives were needed to absorb the bondline shear stresses caused by the thermal expansion mismatch between the die and the high expansion, high thermally conductive substrates. One large application in the marketplace is the attachment of large area, flip chip microprocessor devices to a high expansion, high thermally conductive heat spreader. Both high conductivity and low modulus properties are needed for this application. Heretofore, the series of adhesives described in U.S. Pat. Nos. 6,111,005, 6,140,402 and 6,265,471 were used in this application. However, the microprocessor devices increased in power density and thus the demand increased for adhesives having even better thermal properties with low elastic modulus.

SUMMARY OF THE INVENTION

The present invention provides die attach pastes which are strong, yet sufficiently elastic to bond large area silicon dies to more expandable substrates without inducing excessive stress yet provided significantly higher thermal properties than the present art. The invention also provides an adhesive with significantly enhanced thermal properties for the attachment of smaller components where the modulus of the cured adhesive is higher. The invention also provides an adhesive paste which can be applied by equipment and processes in the industry without major modifications and produce a bond line and when processed thereby. The invention also provides sufficient adhesion between the component and substrate to pass industry standards for adhesion. Furthermore, because the thermoplastic resins can be repeatedly melted and solidified, those embodiments of the invention are reworkable and suitable for multi-chip module technology.

Specifically, the present invention provides an adhesive paste comprising essentially of: (A) about 2-20 weight percent organic polymer resin; (B) up to 30 weight percent fugitive liquid; and [0010](C) about 5-98 weight percent inorganic filler; wherein the filler is present in particulate form and at least about 80% of the filler particles are characterized by round edges and substantially free from flat surfaces.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
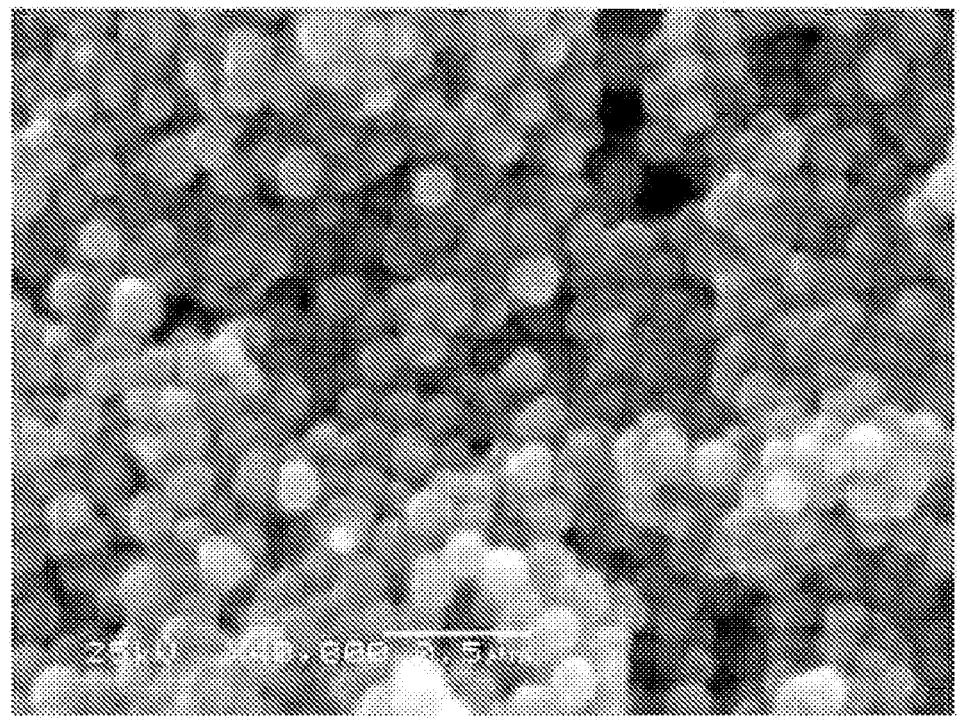
FIG. 1 is a micrograph of nano-silver that is used in conductive compositions according to an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

A detailed description of the principal components of the adhesive pastes of the present invention are described in U.S. Pat. Nos. 6,111,005 and 6,265,471. The key difference is the substitution of spherical shaped silver powders for the silver flakes in the adhesive composition, preferably in the presence of a sintering aid. The spherical powders produced a highly sintered, more dense structure than the same paste with silver flakes. This produces an unexpected decrease in the bulk electrical resistivity and an increase in thermal conductivity. Furthermore, the adhesion was increased which allowed for a decrease in the resin content (higher silver-to-resin ratio) which further increases the thermal conductivity.

The inorganic filler used in the adhesive pastes of the present invention is present in particulate form. At least about 80% of the filler particles, and preferably substantially all of the filler particles, are characterized by round edges, and substantially free from flat surfaces. Substantially spherical particles are especially preferred. It is also preferred that the inorganic filler be substantially free from surfactant. Representative of filler particles which can be use in the present invention are those available from Metalor Technologies USA of Attlebro, Mass. K82P and P318-8.

The inorganic filler is preferably used in combination with at least one sintering aid, that is, any additive that enhances the sintering of the filler. Representative sintering aids include metal resinates and silver oxides. The sintering aid is generally present in a concentration of about from 0.1 to 0.5 weight percent of the cured materials.

The unexpected increase in electrical and thermal properties is not fully understood, but is believed to be due to the better packing and point contacts of the spheres as compared to the geometry of the flakes previously used in plastics of this type. Also believed to be significant is the absence of a surfactant or lubricant present in the flaking process, which leaves a residue on the surface of the flake. This organic layer tends to thermally isolate one flake from another.

In the powder resin technology previously described, when the assembly is heated, the resin powder melts and coalesces with other particles and migrates toward the bondline interfaces. This melting of the powders leaves a void in the bondline, hereafter referred to "bond drop out" (BDO). This distribution of BDO voiding or porosity is considered a key property of the bondline and controls the shear stresses created by the mismatch in expansion of the two components being bonded. The size and amount of these pores is a direct function of the amount of resin an the size distribution of the polymer powders. Without the pores, the present invention provides a highly sintered silver filler which by itself is high in modulus of elasticity. The distribution of pores from the powdered resin melting reduces the modulus of elasticity of the cured bondline. Resin leaving creates pores. The final porosity is accordingly a function of the initial volume of the powdered resin.

The sphere has the smallest surface area among all surfaces enclosing a given volume, and it encloses the largest volume among all closed surfaces with a given surface area. Thus, the number of contacts between spheres would be lower in number than a flake for a given volume of filler. Since the primary path of thermal conductivity is through the bulk of the filler, for the highest flow of heat, the number of particle contacts per unit volume of filler should be kept to a minimum. The packing density of the filler is the other key factor in determining the heat flow. This packing density can be enhanced by the particle size distribution of the spheres as illustrated in the examples to follow.

The present adhesive pastes preferably further comprise up to about 3.0 weight % reducing agent. A wide variety of reducing agents can be used, including organic, inorganic, organometallic, or salt compounds. Representative of reducing agents which can be used are hydrazine, phenylhydrazine, N,N-diethylhydroxylamine, hydroxylamine phosphate (HAP), hydroxylamine sulfate (HAS), ammonium hydrogen sulfate, ammonium hydrogen phosphate (AUP), ammonium dihydrogen phosphate, ammonium nitrate, and ammonium sulfate.

Other sphere-like shapes can also be use in the present invention. In mathematics, a spheroid is a quadratic surface in three dimensions obtained by rotating an ellipse about one of its principal axes. Thus, a sphere is a special case of the spheroid in which the generating ellipse is a circle.

To illustrate the invention, combinations of filler, resin and fugitive liquid were combined in a paste. The preparation of the adhesive from its principal components, and its methods of application and use, take advantage of the various methods and employ equipment well known in the art. The principal components can be mixed in equipment known in the art for paste preparation. Details of this process are described in the prior art cited and referenced above.

The die attach adhesives of the present invention are typically used for attaching microcircuit electronic components to a substrate. In general, this comprises making an adhesive paste of the present invention; followed by applying the paste to a surface of a substrate to form a bond line and placing the electronic component on the bond line so that the paste is between the electronic component and the substrate; followed by heating the assembly to a sufficiently high temperature for a sufficient time that the organic thermoplastic resin softens and becomes fluid, but does not degrade, and the liquid devolatilizes from the paste; followed by cooling the heat-treated assembly to a temperature below which the thermoplastic polymer becomes solid, whereby the microcircuit electronic component is bonded to the substrate by a void-free bond line. When thermoset resin is used, rather than as a particle, as part or all of the organic polymer, the processing temperature should be sufficiently high to crosslink the resin.

For purposes of demonstrating the invention, the pastes are doctor bladed on a glass side, as well as deposited on a ceramic substrate before the die is placed on the wet adhesive. All curing was done at 200.degree. C. peak for 30 minutes. After curing, a force perpendicular to the side of the die was applied until the die was sheared off the substrate. This force was recorded in psi as the adhesion value for the particular composition being test. The strips of adhesive on the glass slides were measured for resistance and recorded as a bulk resistivity in micro ohm-cm. This resistivity value has a strong relationship to the thermal conductivity since the mechanism for thermal transport is by electrons, the same mechanism as in electrical conductivity. Because of the relationship between electrical resistance and thermal conductivity, the resistivity value served as an indicator of which compositions would be further tested for thermal conductivity. The thermal conductivity measurements were done by the known laser flash method.

As used herein, the expression "consists essentially of" means that the composition may include additional components other than the principal, named components, provided that the additional components are not present in an amount sufficient to detract from the operability of the present invention.

The present invention is now illustrated by examples of certain representative embodiments thereof, where all parts, proportions, and percentages are by weight unless otherwise indicated. The examples are intended to be illustrative only, and modifications and equivalents of the invention will be evident to those skilled in the art.

Examples 1-25 and Comparative Examples A-D

In the Examples in Table 1 below, pastes were prepared by the procedure described above, and illustrate the impact of filler morphology on resistivity.

TABLE I

| Example # | Ag Filler | Filler Ratio | Morphology | Tap Density (g/cc) | Surface Area (m2/g) | Polymer | Resistivity Ohm-cm |
|---|---|---|---|---|---|---|---|
| A | 67/80 | 50/50 | Flake-Flake | 3.3-3.8/3.9-4.8 | 1.4-2.0/0.44-0.57 | None | 9.2 |
| 1 | 80/K82P | 50/50 | Flake-Sphere | 3.9-4.8/4.9-6.0 | 0.44/0.57/0.7-1.9 | None | 7.7 |
| 2 | K82P/P318-8 | 50/50 | Sphere-Sphere | 4.9-6.0/5.53 | 0.7-1.9/0.28 | None | 5.4 |
| 3 | 1081P/P318-8 | 50/50 | Sphere-Sphere | 3.6-6.9/5.53 | 0.3-0.8/0.28 | None | TBD |

Examples in Table 2 below illustrate the impact of metal resinate on resistivity and thermal conductivity of the adhesive paste.

TABLE 2

| Example # | Ag Filler | Filler Ratio | Morphology | Silver Resinate AD9144 | Polyester Polymer | Thermal Conductivity (W/mK) | Resistivity (ohm-cm) |
|---|---|---|---|---|---|---|---|
| 4 | K82/P318-8 | 50/50 | Sphere-Sphere | 0% | 4709 | 7.76 | 94.7 |
| 5 | K82/P318-8 | 50/50 | Sphere-Sphere | 3% | 4709 | 5.1 | 38.1 |
| 6 | K82/P318-8 | 50/50 | Sphere-Sphere | 5% | 4709 | 20.1 | TBD |
| 7 | 1081P/P318-8 | 50/50 | Sphere-Sphere | 0% | 4709 | 13.42 | 90.7 |
| 8 | 1081P/P318-8 | 50/50 | Sphere-Sphere | 3% | 4709 | 34.03 | 21.4 |
| 9 | 1081P/P318-8 | 50/50 | Sphere-Sphere | 5% | 4709 | 30.16 | 20.0 |

Examples in Table 3 below illustrate the impact of filler loading on resistivity.

TABLE 3

| Example # | Ag Filler | Filler Ratio | Morphology | Wt % Filler | Polyester Polymer | Resistivity ohm-cm |
|---|---|---|---|---|---|---|
| 10 | K82P/318-8 | 50/50 | Sphere-Sphere | 92 | 4709 | 13.0 |
| 11 | K82P/318-8 | 50/50 | Sphere-Sphere | 93 | 4709 | 12.0 |
| 12 | K82P/318-8 | 50/50 | Sphere-Sphere | 94 | 4709 | 9.8 |

Examples in Table 4 below illustrate the impact of filler morphology in powdered resin system on resistivity and thermal conductivity. Example 14 represents the most preferred embodiment of the present invention.

TABLE 4

| Example # | Ag Filler | Filler Ratio | Morphology | Wt % Polymer | Polymer | Thermal Conductivity (W/mK) | Resistivity ohm-cm |
|---|---|---|---|---|---|---|---|
| 13 | 80/K82P | 20/80 | Flake-Sphere | 8 | 4709 | 14.2 | 12.7 |
| 14 | K82P/P318-8 | 50/50 | Sphere-Sphere | 7 | 4709 | 42.8 | 10.8 |

Examples in Table 5 below illustrate the impact of filler morphology in epoxy resin system on resistivity and thermal conductivity.

TABLE 5

| Example # | Ag Filler | Filler Ratio | Morphology | Tap Density (g/cc) | Surface Area (m2/g) | Epoxy Polymer | Thermal Conductivity (W/mK) | Resistivity (ohm-cm) |
|---|---|---|---|---|---|---|---|---|
| C | 80/113 | 50/50 | Flake-Flake | 3.9-4.8/4.5-5.4 | 0.44-0.57/0.7-1.2 | 5415 | 30.8 | 9.6 |
| 15 | K82P/P318-8 | 50/50 | Sphere-Sphere | 4.9-6.0/5.53 | 0.7-1.9/0.28 | 5415 | 44.7 | 9.2 |

Examples in Table 6 below illustrate the impact of filler morphology in another epoxy resin system on resistivity and thermal conductivity.

TABLE 6

| Example # | Ag Filler | Filler Ratio | Morphology | Epoxy Polymer | Thermal Conductivity (W/mK) | Resistivity (ohm-cm) |
|---|---|---|---|---|---|---|
| D | 4561 | NA | Flake | TH2-44-1 | 8.1 | 25.2 |
| 16 | K82P/P318-8 | 50/50 | Sphere-Sphere | TH2-44-1 | 32.22 | 26.2 |

As the examples illustrate, the inclusion of a sphere shaped particles of Ag, in the presence of a Ag resinate as a sintering aid, yielded significantly lower electrical resistance and higher thermal conductivity, although the relationship was not always linear.

TABLE 7

| Example # | Ag Filler | Filler Ratio | Morphology | Reducing Agent | Amount of Reducing Agent (%) | Polyester Polymer | Thermal Conductivity (W/mK) | Resistivity (ohm-cm) |
|---|---|---|---|---|---|---|---|---|
| 17 | K82P/P318-8 | 50/50 | Sphere-Sphere | None | 0% | 4709 | 5.1 | 38.1 |
| 18 | K82P/P318-8 | 50/50 | Sphere-Sphere | HAS | 0.2% | 4709 | 32.1 | 17.3 |
| 19 | K82P/P318-8 | 50/50 | Sphere-Sphere | HAP | 0.2% | 4709 | 9.01 | 15.9 |
| 20 | K82P/P318-8 | 50/50 | Sphere-Sphere | AHP | 0.2% | 4709 | 30.4 | 14.5 |
| 21 | 1081P/P318-8 | 50/50 | Sphere-Sphere | None | 0% | 4709 | 34.03 | 21.4 |
| 22 | 1081P/P318-8 | 50/50 | Sphere-Sphere | AHP | 0.2% | 4709 | 33.73 | 17.6 |

Examples in Table 8 below illustrate the impact of pressure during curing on interfacial thermal resistance.

TABLE 8

| Example # | Ag Filler | Filler Ratio | Pressure (PSI) | Epoxy Polymer | Bond Line Thickness (mils) | Interfacial Thermal Resistance (Kcm2/W) |
|---|---|---|---|---|---|---|
| 23 | 1081P/P318 | 50/50 | 11 | 4709 | 2.2 | 0.0519 |
| 24 | 1081P/P318 | 50/50 | 22 | 4709 | 1.8 | 0.0519 |
| 25 | 1081P/P318 | 50/50 | 0 | 4709 | 1.8 | 0.0519 |

Figure 2:
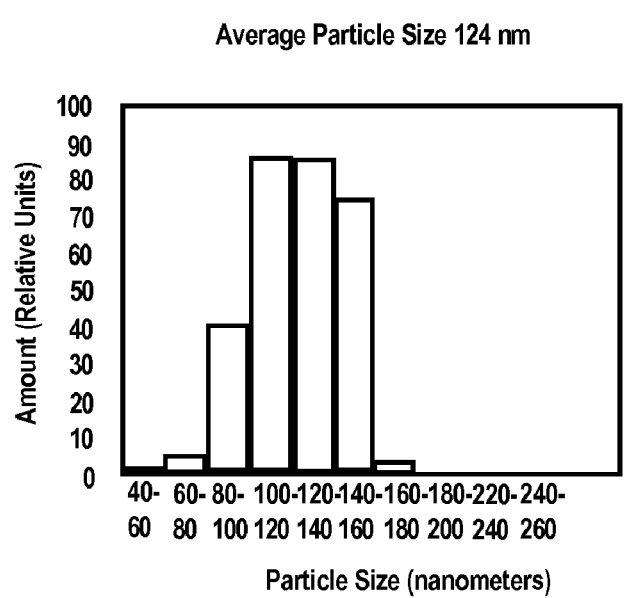
FIG. 2 is a particle size distribution for the nanosilver shown in FIG. 1.

It has been found that adding a small percentage of very fine (nanoscale) silver particles having particle diameters less than 200 nanometers along with a sintering aid leads the further increased thermal performance. FIG. 1 shows an SEM micrograph of nanoscale silver particles that have been added to conductive compositions according to embodiments of the invention. The nanoscale silver particles are spherical in shape. FIG. 2 shows a size distribution for the particles shown in FIG. 1. The average particle size in this case is 124 nanometers. Alternatively, in lieu of nanoscale silver nanoscale, Au, Cu, Sn, Pd or Pt may be used.

The sintering aid is suitably a metallic compound, and may for example comprise an organometallic, a metal-organic salt, a metal mercaptan and/or a resinate. According to certain embodiments the sintering aid includes the same metal as the conductive fill particles are made of e.g., silver. Examples of metal mercaptans that may be used as the sintering aid include silver t-dodecylmercaptan and silver diethyldithiocarbamate.

Examples of other organometallic compounds that may be used include bis-($\eta^1$-4-phenyl-$\eta^2$-1-butene)silver(I). Examples of metal-organic salt compounds that may be used as the sintering aid include silver (I) hexafuoropentanedionatecyclooctadiane complex, silver neodecanoate, silver 2,4-pentafluoropropionate, silver 2,4-pentanedionate, silver tosylate. According to certain embodiments resinate is at least 0.25% by weight of the conductive composition. According to certain embodiments the conductive (e.g., silver) particles having diameters less than 200 nanometers are at least 1% by weight of the conductive composition.

Figure 3:
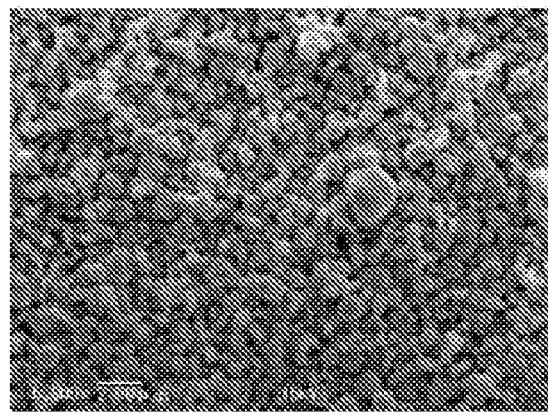
FIG. 3 is a micrograph of a thick plate shaped micron sized silver particles that are used in conductive compositions according to embodiments of the invention.
Figure 4:
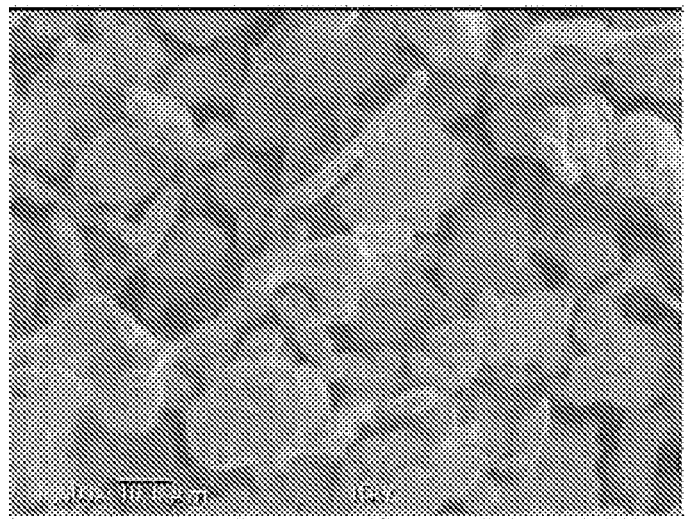
FIG. 4 is a micrograph of spherical shaped micron sized silver particles that are used in conductive compositions according to embodiments of the invention.

In certain embodiments these fine conductive particles are used in combination with larger conductive particles that have an average diameter greater than 300 nanometers and in some cases greater than 10 microns. Good performance has been obtained when mixing two types of larger particles that have two different morphologies. It has been found that a combination of what are termed "spherical" morphology larger particles defined herein as particles with an aspect ratio less than 1.3:1 and thick plate shaped particles which have an aspect ratio of about 5 but are defined herein more broadly as particles having an aspect ratio between 3:1 and 10:1 yielded improved thermal performance. FIG. 3 is an SEM micrograph showing "spherical" morphology larger particles that are used in conductive compositions according to embodiments of the invention and FIG. 4 is an SEM of thick plate shaped micron scale particles that have been used in conductive compositions according to embodiments of the invention. The "spherical" particles shown in FIG. 3 have a surface area of 0.7-1.9 m$^2$/g, a tap density of 4.9-6.0 grams/cc and an average particle size between of 1.7 with a range of particle sizes from 0.9 to 2.7 microns. More generally the "spherical" particles preferably have a particle size greater than 0.5 microns. The thick plate shaped particles shown in FIG. 4 have a surface area 0.05-0.15 m$^2$/g, a tap density of 5.5-7.1 grams/cc and an average particle size of 18 microns, with a range of particle size from 8 to 36 microns. More generally in embodiments of the present invention it is beneficial to use thick plate shaped particles that have an average particle size that is larger than 10 microns.

It is preferred to use about equal amounts by weight of the "spherical" morphology particles shown in FIG. 3 and the thick plate shaped particles shown in FIG. 4. Generally a weight proportions of "spherical" to thick plate shaped larger particles is between 40:60 and 60:40.

Table 9 below provides information showing the advantage of adding both nanosilver and a sintering aid (e.g., resinate) in comparison to using either of these constituents alone. The entries in the table are thermal conductivity in units of W/mK. As shown adding 5% by weight of nanosilver AND 0.45% by weight (based on the total weight of the uncured composition) of silver resinate yields a thermal conductivity of 58 W/mK whereas adding 5% nanosilver without silver resinate yielded thermal conductivity of only 7 W/mK and adding 5% silver resinate without nanosilver yielded thermal conductivity of only 19 W/mK. The silver resinate used in these tests was silver t-dodecyl mercaptan based. Table 9 is based on conductive compositions that in addition to the components shown in Table 9 also included a 50/50 mixture of the "spherical" and thick plate morphology larger silver powders shown in FIG. 3 and FIG. 4, a polyester resin binder and a linear paraffin based fugitive vehicle.

TABLE 9

|  |  | % nanosilver | |
| --- | --- | --- | --- |
|  |  | 0% | 15% |
| % silver resinate | 0% | 8 W/mK | 7 W/mK |
|  | 0.45% | 19 W/mK | 58 W/mK |

Figure 5:
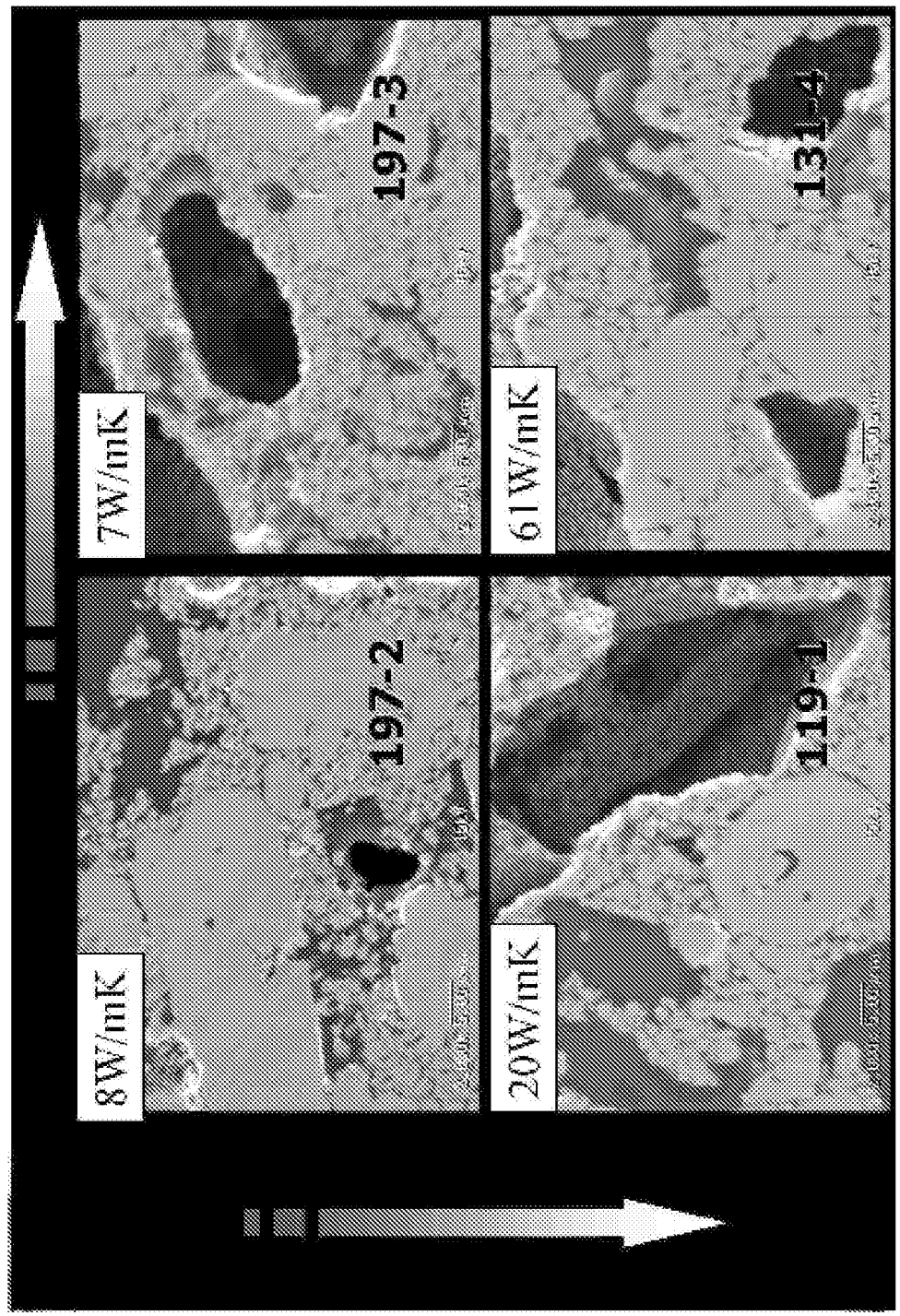
FIG. 5 is a matrix of four micrographs showing four different conductive compositions in comparison to each other at 2,000× magnification.
Figure 6:
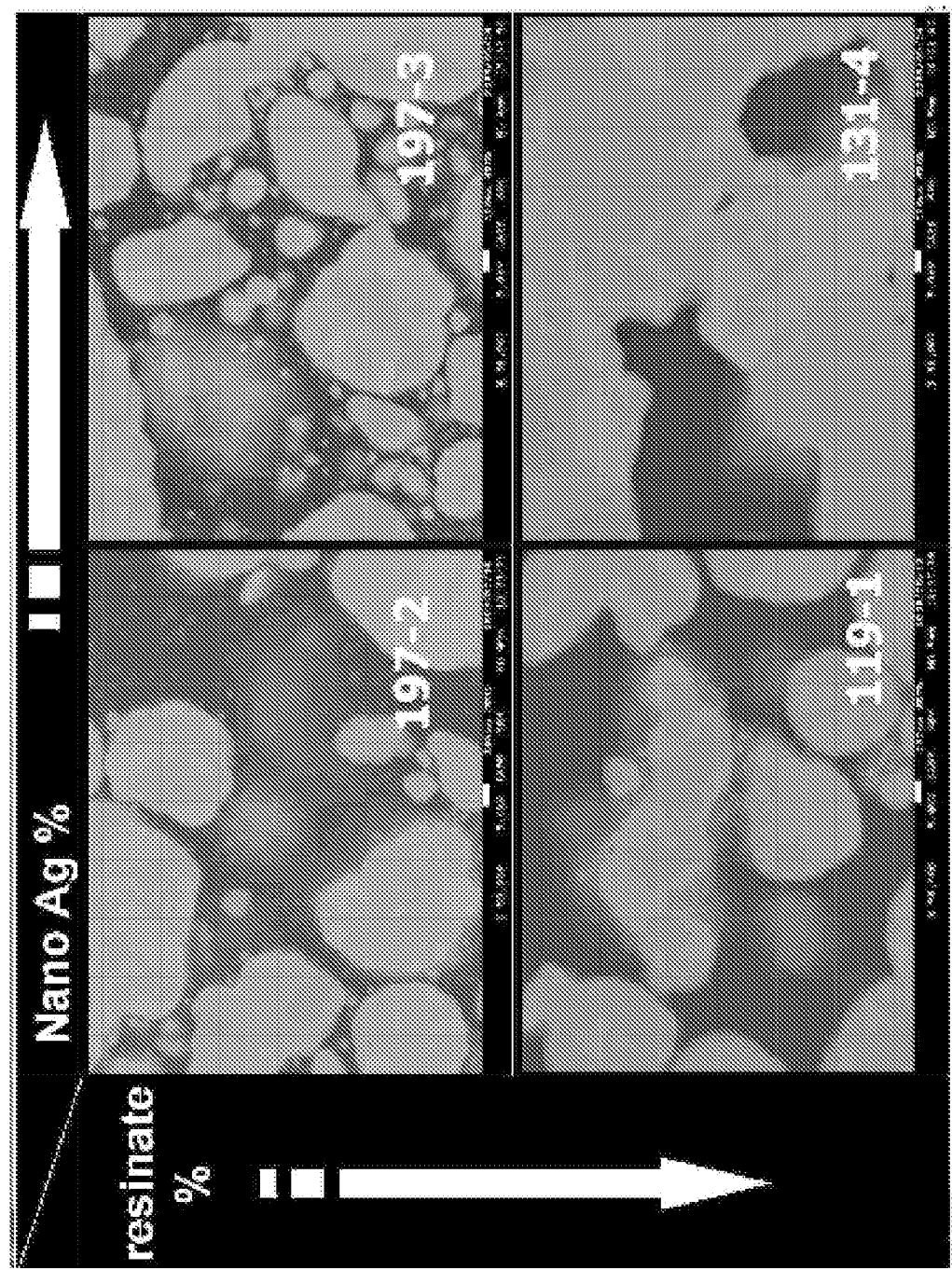
FIG. 6 is a matrix of four micrographs showing the same conductive compositions as shown in FIG. 5 but at 50,000× magnification.

FIG. 5 and FIG. 6 are SEM micrographs of the four conductive compositions in Table 9. The arrangement of the micrographs in FIGS. 5,6 (with the page oriented in the landscape orientation) corresponds to the arrangement of entries in Table 9. FIG. 5 shows the conductive compositions at a magnification of 2,000× and FIG. 6 shows the conductive compositions at a magnification of 50,000×. At 50,000× it is apparent that the composition that included both 5% nanosilver and 5% silver resinate (shown at the lower right) the silver was subsumed to a greater degree into a contiguous matrix. This more contiguous matrix of silver is believed to account for the higher thermal conductivity that was obtained.

As in the case of embodiments described above, the conductive composition including the nanoscale particles can further beneficially include a resin binder and a fugitive liquid, such as described above. According to certain embodiments the nanoscale conductive particles comprise 0.1% to 10%, the micron scale conductive particles comprise at least 75%, the resin binder comprises 2% to 25% and the fugitive vehicle comprise 5% to 15% of the conductive composition.

Figure 7:
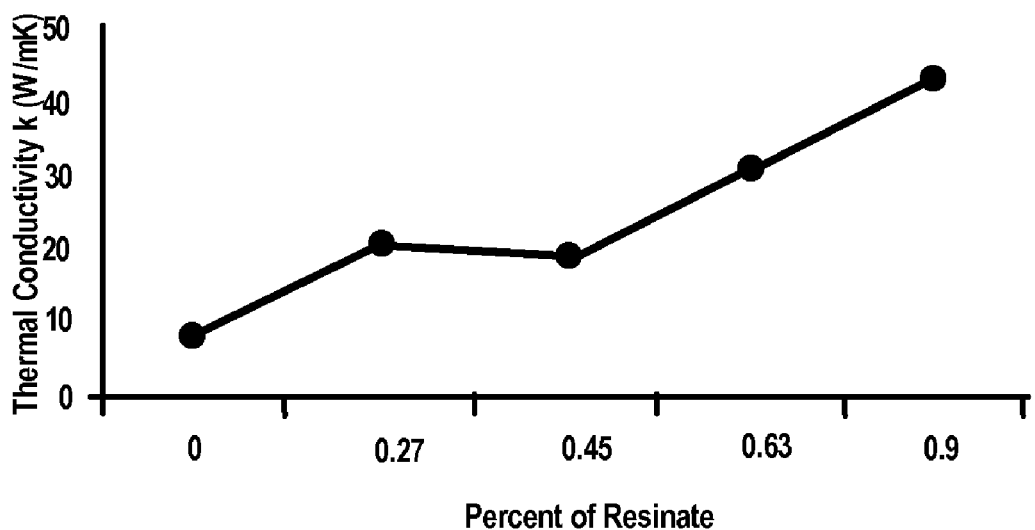
FIG. 7 is a plot of thermal conductivity versus percentage of resinate (relative to the weight of the uncured conductive composition).

Adding metal resinate (e.g., silver resinate) without adding nanoscale silver yields a significant increase in thermal conductivity that may be viable and competitive for certain applications. FIG. 7 is a plot of thermal conductivity versus percentage of resinate (relative to the weight of the uncured conductive composition). The thermal conductivity increases from 8 W/mK at 0% resinate to 43 W/mK at 0.9% resinate. This data is based on a formulation that in addition to the resinate included a 50/50 mix of 'spherical' and thick plate microsilver powders, polyester resin binder, and a linear paraffin with a molecular weight of about 150 grams/mole fugitive vehicle. A mercaptan silver resinate manufactured by BASF of East Newark, N.J. was used.

In typical embodiments of the invention the thermal conductivity of the conductive compositions are correlated with the electrical conductivity. This is due to the fact that the thermal conductivity arises in large measure to electron mobility within the metallic fill. Some applications of the conductive composition require the thermal conductivity and some applications require the electrical conductivity. Some applications may require both. An application where the electrical conductivity is the principle requirement is in the use of the conductive composition for forming electrically conductive circuit traces on a panel. Such applications can use a conductive composition recipe that includes nanoscale silver and resinate in a fugitive carrier. In certain embodiments no further ingredients will be necessary. Such a conductive composition can, for example, be applied by screen printing to a substrate. The firing temperature of the composition is relatively low which means a wider range of substrates including substrates that have lower heat tolerance may be used.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A conductive composition comprising: a first type of metal particles; and a metallic compound sintering aid, wherein the metallic compound sintering aid comprises a metal mercaptan.

2. The conductive composition according to claim 1, wherein the first type of metal particles have an average diameter that is less than 200 nanometers.

3. The conductive composition according to claim 1, wherein the first type of metal particles and the metallic compound sintering aid each comprise a common metal selected from the group consisting of Ag, Au, Cu, Sn, Pd and Pt.

4. A conductive composition comprising: a first type of metal particles; and a metallic compound sintering aid, wherein the metallic compound sintering aid comprises a resinate.

5. The conductive composition according to claim 4, wherein the resinate is present in an amount of at least 0.25% in the conductive composition.

6. The conductive composition according to claim 5, wherein the first type of metal particles have an average diameter that is less than 200 nanometers.

7. The conductive composition according to claim 5, wherein the first type of metal particles and the metallic compound sintering aid each comprise a common metal selected from the group consisting of Ag, Au, Cu, Sri, Pd and Pt.

8. The conductive composition according to claim 4, wherein the first type of metal particles have an average diameter that is less than 200 nanometers.

9. The conductive composition according to claim 4, wherein the first type of metal particles and the metallic compound sintering aid each comprise a common metal selected from the group consisting of Ag, Au, Cu, Sn, Pd and Pt.

10. A conductive composition comprising: a first type of metal particles; a metallic compound sintering aid; and a second type of metal particles having an average diameter of greater than 0.5 microns, wherein the first type of metal particles have an average diameter that is less than 200 nanometers and the second type of metal particles have an aspect ratio of between 3:1 and 10:1.

11. The conductive composition according to claim 10 further comprising a third type of metal particles that have an average diameter of at least 0.5 microns and have an aspect ratio less than 1.3:1.

12. The conductive composition according to claim 11, wherein the first type of metal particles and the metallic compound sintering aid each comprise a common metal selected from the group consisting of Ag, Au, Cu, Sn, Pd and Pt.

13. The conductive composition according to claim 11, wherein the first type of metal particles comprise silver and the metallic compound sintering aid comprises silver.

14. The conductive composition according to claim 11, wherein the metallic compound sintering aid comprises an organometallic compound.

15. The conductive composition according to claim 14, wherein the metallic compound sintering aid comprises a metal organic compound.

16. The conductive composition according to claim 11, wherein the metallic compound sintering aid comprises a metal organic salt compound.

17. The conductive composition according to claim 11, wherein the metallic compound sintering aid comprises a metal mercaptan.

18. The conductive composition according to claim 11, wherein the metallic compound sintering aid comprises a compound selected from the group consisting of: a (I)hexafluoropentanedionatecyclooctadiane complex, silver neodecanoate, silver 2,4-pentafluoropropionate, silver 2,4-pentanedionate and silver tosylate.

19. The conductive composition according to claim 11, wherein the metallic compound sintering aid comprises bis-($\eta^1$-4-phenyl-$\eta^2$-1-butene)silver (I).

20. The conductive composition according to claim 11, wherein the metallic compound sintering aid comprises a compound selected from the group consisting of silver t-dodecylmercaptan and silver diethyldithiocarbamate.

21. The conductive composition according to claim 11, wherein the sintering aid comprises a resinate.

22. The conductive composition according to claim 21, wherein the resinate is present in an amount of at least 0.25% in the conductive composition.

23. The conductive composition according to claim 11, wherein the first type of metal particles constitute at least 1% by weight of the conductive composition.

24. The conductive composition according to claim 23, wherein the metallic compound sintering aid constitutes at least 0.25% by weight of the conductive composition.

25. The conductive composition according to claim 11, wherein the second type of metal particles have an average diameter greater than ten microns.

26. The conductive composition according to claim 11, wherein the second type of metal particles comprise silver.

27. The conductive composition according to claim 1 further comprising a resin binder.

28. The conductive composition according to claim 27 further comprising a fugitive liquid.

29. The conductive composition according to claim 28, wherein the first type of metal particles constitute 0.1% to 10% by weight of the conductive composition, the second type of metal particles constitute at least 75% by weight of the conductive composition, the resin binder constitutes 2 to 25% of the conductive composition and the fugitive liquid comprises 5 to 15% of the conductive composition.

30. The conductive composition according to claim 28, wherein the resin binder is insoluble in the fugitive liquid.

31. The conductive composition according to claim 10, wherein the first type of metal particles and the metallic compound sintering aid each comprise a common metal selected from the group consisting of Ag, Au, Cu, Sn, Pd and Pt.

32. The conductive composition according to claim 10, wherein the first type of metal particles comprise silver and the metallic compound sintering aid comprises silver.

33. The conductive composition according to claim 10, wherein the metallic compound sintering aid comprises an organometallic compound.

34. The conductive composition according to claim 10, wherein the metallic compound sintering aid comprises a metal organic compound.

35. The conductive composition according to claim 10, wherein the metallic compound sintering aid comprises a metal organic salt compound.

36. The conductive composition according to claim 10, wherein the metallic compound sintering aid comprises a metal mercaptan.

37. The conductive composition according to claim 10, wherein the metallic compound sintering aid comprises a compound selected from the group consisting of: a (I)hexafluoropentanedionatecyclooctadiane complex, silver neodecanoate, silver 2,4-pentafluoropropionate, silver 2,4-pentanedionate and silver tosylate.

38. The conductive composition according to claim 10, wherein the metallic compound sintering aid comprises bis-($\eta^1$-4-phenyl-$\eta^2$-1-butene)silver (I).

39. The conductive composition according to claim 10, wherein the metallic compound sintering aid comprises a compound selected from the group consisting of silver t-dodecylmercaptan and silver diethyldithiocarbamate.

40. The conductive composition according to claim 10, wherein the sintering aid comprises a resinate.

41. The conductive composition according to claim 40, wherein the resinate is present in an amount of at least 0.25% in the conductive composition.

42. The conductive composition according to claim 10, wherein the first type of metal particles constitute at least 1% by weight of the conductive composition.

43. The conductive composition according to claim 42, wherein the metallic compound sintering aid constitutes at least 0.25% by weight of the conductive composition.

44. The conductive composition according to claim 10, wherein the second type of metal particles have an average diameter greater than ten microns.

45. The conductive composition according to claim 10, wherein the second type of metal particles comprise silver.

* * * * *